United States Patent
Yamaguchi

(10) Patent No.: US 6,809,951 B2
(45) Date of Patent: Oct. 26, 2004

(54) FERROELECTRIC SEMICONDUCTOR MEMORY

(75) Inventor: Tetsuya Yamaguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/279,853

(22) Filed: Oct. 25, 2002

(65) Prior Publication Data

US 2003/0086285 A1 May 8, 2003

(30) Foreign Application Priority Data

Oct. 25, 2001 (JP) ........................................ 2001-328057

(51) Int. Cl.[7] .............................................. G11C 11/22
(52) U.S. Cl. ...................... 365/145; 365/149; 365/222; 365/185.08
(58) Field of Search ................................ 365/145, 149, 365/222, 185.01, 185.08; 257/295, 296

(56) References Cited

U.S. PATENT DOCUMENTS

| | | | |
|---|---|---|---|
| 5,753,946 A | * 5/1998 | Naiki et al. | 257/295 |
| 6,067,244 A | * 5/2000 | Ma et al. | 365/145 |
| 6,201,731 B1 | 3/2001 | Kamp et al. | 365/185.02 |
| 6,370,056 B1 | * 4/2002 | Chen et al. | 365/145 |
| 6,438,021 B2 | * 8/2002 | Kato | 365/145 |
| 6,452,852 B2 | * 9/2002 | Bohm et al. | 365/222 |
| 6,473,329 B1 | * 10/2002 | Nakamura | 365/145 |

* cited by examiner

*Primary Examiner*—Son Mai
(74) *Attorney, Agent, or Firm*—Oblon, Spivak, McClelland, Maier & Neustadt, P.C.

(57) ABSTRACT

A ferroelectric semiconductor memory includes a cell array in which a plurality of ferroelectric memory cells are arranged in a matrix format, and a circuit section. Each memory cell includes a field-effect transistor and a capacitor formed as a gate electrode section of the field-effect transistor and having a stacked structure of metal film/ferroelectric film/metal film. The circuit section selectively executes a read mode, program mode, and erase mode for performing data read, programming, and erase to the memory cells, and a rewrite mode for rewriting data stored in each memory cell.

19 Claims, 8 Drawing Sheets

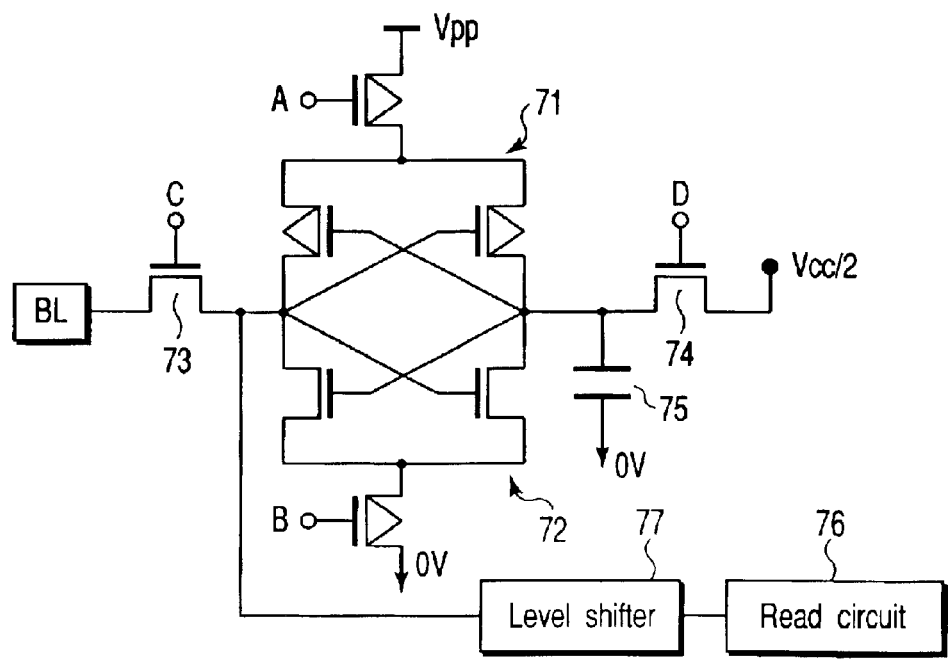
F I G. 7
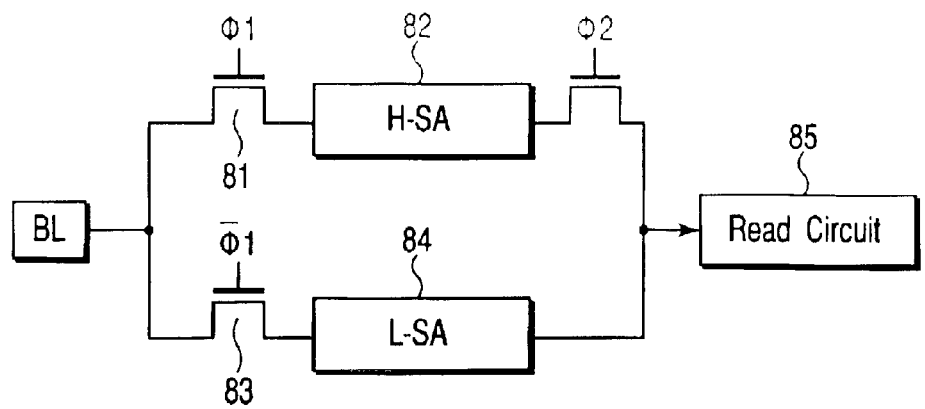
F I G. 8

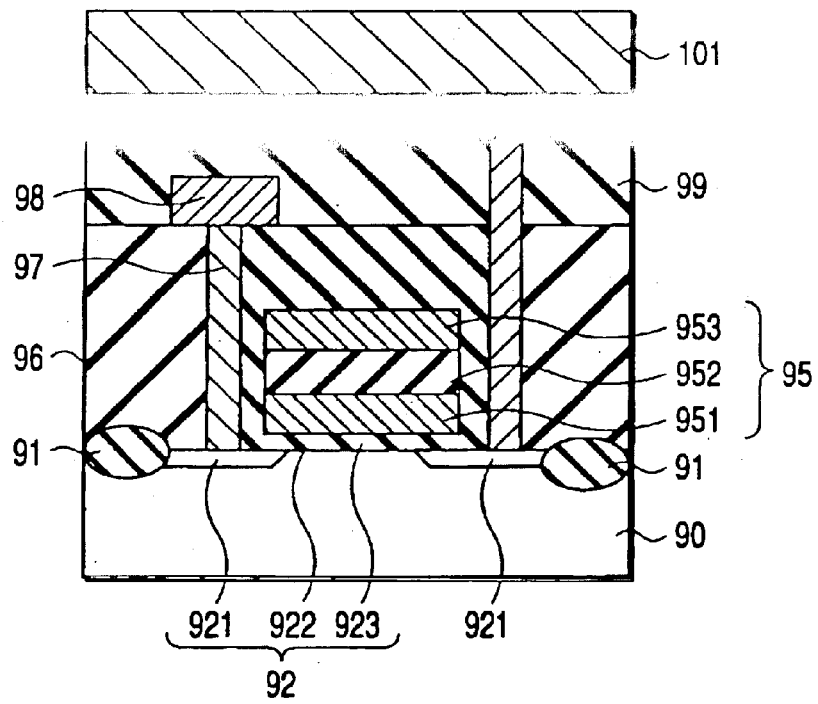
F I G. 10

FERROELECTRIC SEMICONDUCTOR MEMORY

CROSS-REFERENCE TO RELATED APPLICATION

This application is based upon and claims the benefit of priority from the prior Japanese Patent Application No. 2001-328057, filed Oct. 25, 2001, the entire contents of which are incorporated herein by reference.

BACKGROUND OF THE INVENTION

1. Field of the Invention

The present invention relates to a ferroelectric memory (ferroelectric random access memory) having a cell array in which a plurality of ferroelectric memory cells are arranged in a matrix format. Each memory cell includes a field-effect transistor and a capacitor formed as a gate electrode section of the field-effect transistor and having a stacked structure of metal film/ferroelectric film/metal film. Typically, this memory cell is known as a memory cell having an MFMIS (Metal/Ferroelectric/Metal/Insulator/Semiconductor) structure. This ferroelectric memory is used in an integrated circuit dedicated to a memory, a logic-in-memory integrated circuit, and the like.

2. Description of the Related Art

A ferroelectric memory as a nonvolatile memory is characterized by nondestructive read-out and generally requires no rewrite action. However, as devices are micropatterned, the device structures change, or the ferroelectric film quality deteriorates owing to limitations in the process, the polarization characteristics of a ferroelectric capacitor are disturbed in a relatively short time period and memory information is destroyed. This problem will be described in detail below.

FIG. 9 shows the sectional structure of a representative 1-transistor-•1-capacitor (1T•1C) ferroelectric memory cell.

A device isolation region 81 is formed on a silicon substrate 80. This ferroelectric memory cell has a MIS (Metal Insulator Semiconductor) transistor 82 and ferroelectric capacitor 83. The MIS transistor 82 includes impurity diffusion regions 821 as a drain and source, a channel region 822, a gate insulating film 823, and a gate electrode 824. The ferroelectric capacitor 83 includes a lower electrode 831, ferroelectric film 832, and upper electrode 833.

Interlevel insulating films 84 and 85 are formed on the substrate 80. W (tungsten) plugs 86 and 88 are formed to extend through these interlevel insulating films 84 and 85. The plug 86 connects the drain 821 of the MIS transistor and an Al (aluminum) bit line 87. The plug 88 connects the source 821 of the MIS transistor and an Al line 89. This Al line 89 connects the plug 88 to the upper electrode 833 of the ferroelectric capacitor.

This ferroelectric memory cell shown in FIG. 9 has a structure (offset structure) in which the MIS transistor 82 and ferroelectric capacitor 83 are separated in the lateral direction. Since this inevitably increases the size in the lateral direction, a problem arises from the viewpoint of high integration.

Recently, therefore, a 1-transistor (1T) ferroelectric memory cell in which a ferroelectric film is buried in the gate electrode section of a MIS transistor has been studied (T. Nakamura et al., "A Single Transistor Ferroelectric Memory Cell", ISSCC 95). The structure of this 1T ferroelectric memory cell will be described in detail later with reference to embodiments of the present invention. The present inventor has found that the 1T ferroelectric memory cell has the problem that the time (retention) capable of holding memory information reduces.

BRIEF SUMMARY OF THE INVENTION

According to a first aspect of the present invention, there is provided a ferroelectric semiconductor memory comprising a cell array in which a plurality of ferroelectric memory cells are arranged in a matrix format, each memory cell including a field-effect transistor and a capacitor formed as a gate electrode section of the field-effect transistor and having a stacked structure of metal film/ferroelectric film/metal film, and a circuit section which selectively executes a read mode, program mode, and erase mode for performing data read, programming, and erase to the memory cells, and a rewrite mode for rewriting data stored in each memory cell.

According to a second aspect of the present invention, in the rewrite mode, the circuit section successively applies a program voltage and erase voltage to a word line corresponding to a selected memory cell and, in parallel with this voltage application, causes a high-breakdown-voltage sense amplifier to amplify a voltage read out to a bit line corresponding to the selected memory cell, and feeds the amplified voltage back to the corresponding bit line.

According to a third aspect of the present invention, in the rewrite mode, the circuit section applies a read voltage to the corresponding word line to read out data in the selected memory cell to the corresponding bit line and, immediately after that, applies the program voltage and erase voltage to the corresponding word line, and feeds the readout voltage back to the corresponding bit line.

BRIEF DESCRIPTION OF THE SEVERAL VIEWS OF THE DRAWING

FIG. 7 is a circuit diagram showing an example of a high-breakdown-voltage bit line sense amplifier used in the rewrite mode shown in FIG. 6;

FIG. 8 is a circuit diagram showing examples of two types of sense amplifiers and their switching circuit used in a ferroelectric memory cell according to a second embodiment of the present invention;

FIG. 10 is a sectional view showing a ferroelectric memory cell having a 1T MFMIS structure according to an embodiment of the present invention.

DETAILED DESCRIPTION OF THE INVENTION

Figure 1:
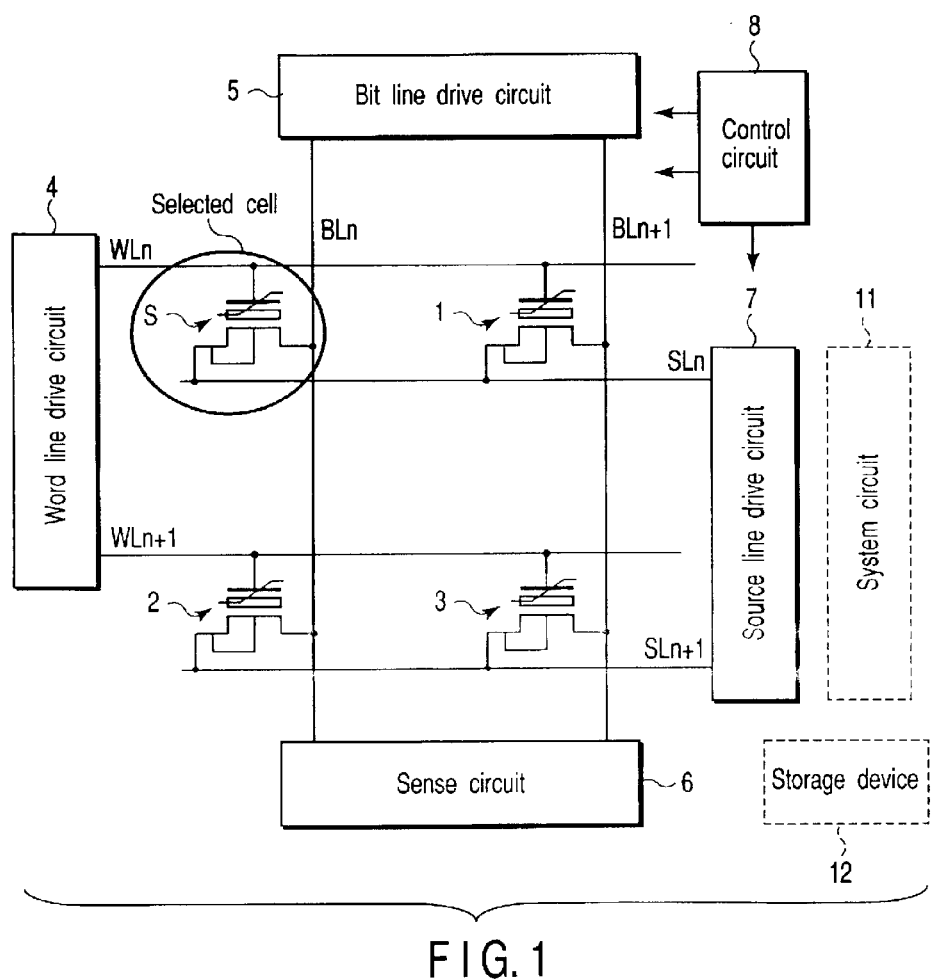
FIG. 1 is a circuit diagram showing part of a ferroelectric memory according to a first embodiment of the present invention.

FIG. 10 is a sectional view showing an MFMIS ferroelectric memory cell (an example of a 1T ferroelectric memory cell) according to an embodiment of the present invention.

A device isolation region 91 is formed on a silicon substrate 90. This ferroelectric memory cell includes a MIS transistor (field-effect transistor) 92, and a ferroelectric capacitor 95 formed as a gate electrode section of the MIS transistor 92 and having a stacked structure of metal film/ferroelectric film/metal film (metal/ferroelectric/metal). The MIS transistor 92 includes impurity diffusion regions 921 as a drain and source, a channel region 922, a gate insulating film 923, and a metal film (gate electrode) 951. The ferroelectric capacitor 95 includes the metal film (lower electrode) 951, a ferroelectric film 952, and a metal film (upper electrode) 953.

Interlevel insulating films 96 and 99 are formed on the substrate 90. A W (tungsten) plug 97 is formed to extend through the interlevel insulating film 96. This plug 97 connects the source 921 of the MIS transistor and an Al source line 98. Another W (tungsten) plug 100 is formed to extend through the interlevel insulating films 96 and 99. This plug 100 connects the drain 921 of the MIS transistor and an Al (aluminum) bit line 101.

In the process of developing the present invention, the present inventor studied the problem of a 1T ferroelectric memory cell as described above with reference to FIG. 10. As a consequence, the present inventor obtained the following finding.

A 1T ferroelectric memory cell is suited to high integration since the cell area can be reduced compared to a 1T•1C ferroelectric memory. However, during the process integration of a transistor and ferroelectric capacitor, the process conditions cannot be independently optimized. This increases the number of process limitations and makes the process technically difficult.

Accordingly, the ferroelectric film quality of a 1T ferroelectric memory cell is generally inferior to that of a 1T•1C ferroelectric memory cell. This poses the problem that the time (retention) capable of holding memory information shortens. For example, the retention of a common 1T•1C ferroelectric memory cell is semipermanent. On the other hand, the retention of a 1T ferroelectric memory cell is presently 10 days or less even on the single device level on which no electrical disturb is present. This is practically fatal as a nonvolatile memory.

This reduction in the retention of a 1T ferroelectric memory cell is more significant in circuit operations in a data program mode or erase mode. That is, when programming or erase is performed for a specific selected cell in a 1T ferroelectric memory cell array, the bias is also applied to other non-selected cells. With this bias, the non-selected cells are strongly affected by electrical disturb to greatly shorten their retention.

As described above, the MFMIS ferroelectric memory has the serious problem in data holding characteristics that memory information is destroyed by the reduction in the retention of a cell. However, it is possible, by imparting the rewrite function to the memory, to suppress this reduction in the retention of the MFMIS ferroelectric memory cell.

Embodiments of the present invention made on the basis of this finding will be explained below with reference to the accompanying drawing. In the following description, the same reference numerals denote constituent elements having substantially the same functions and arrangements, and a repetitive explanation thereof will be made only where necessary.

(First Embodiment)

FIG. 1 is a circuit diagram showing part of a ferroelectric memory according to a first embodiment of the present invention. This ferroelectric memory has a cell array in which a plurality of ferroelectric memory cells are arranged in a matrix format. FIG. 1 representatively shows four N-type ferroelectric memory cells S, 1, 2, and 3 in the cell array. Each memory cell has an MFMIS structure (1T MFMIS structure) as shown in the sectional view of FIG. 10.

The gates of cells in the same row are connected to a common word line WL (WLn, WLn+1, . . . ). The drains of cells in the same column are connected to a common bit line BL (BLn, BLn+1, . . . ). The sources of cells in the same row are connected to a common source line SL (SLn, SLn+1, . . . ). In FIG. 1, S denotes a selected cell, and 1 to 3 denote non-selected cells.

The word lines WL (WLn, WLn+1, . . . ) are driven by a word line drive circuit (WDC) 4. The bit lines BL (BLn, BLn+1, . . . ) are driven by a bit line drive circuit (BDC) 5. A sense circuit 6 including sense amplifiers is connected to the bit lines BL (BLn, BLn+1, . . . ). The source lines SL (SLn, SLn+1, . . . ) are driven by a source line drive circuit (SDC) 7.

Control signals generated by a control circuit 8 are supplied to the word line drive circuit 4, bit line drive circuit 5, and source line drive circuit 7. These control signals control the word line drive circuit 4, bit line drive circuit 5, and source line drive circuit 7, thereby executing a read mode, program mode, erase mode, and rewrite mode as will be described later. In FIG. 1, reference numerals 11 and 12 denote a system circuit section and storage device, respectively, and these components will be described later.

Figure 2A:
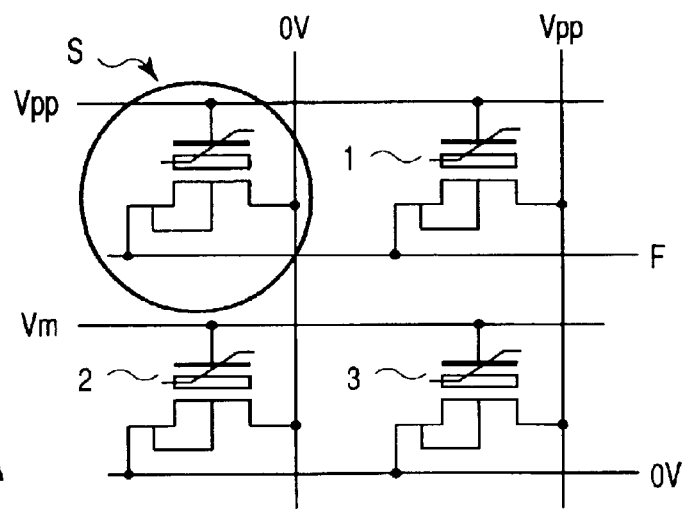
FIGS. 2A to 2C are circuit diagrams showing a data program mode, data erase mode, and data read mode, respectively, of the ferroelectric memory shown in FIG. 1.
Figure 2B:
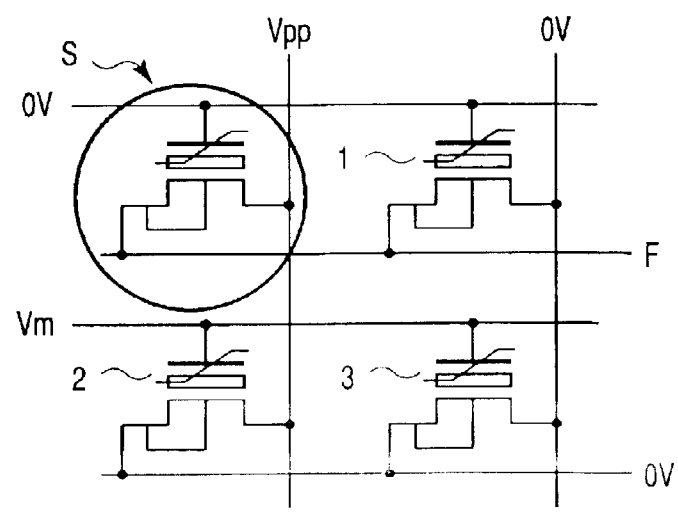
Figure 2C:
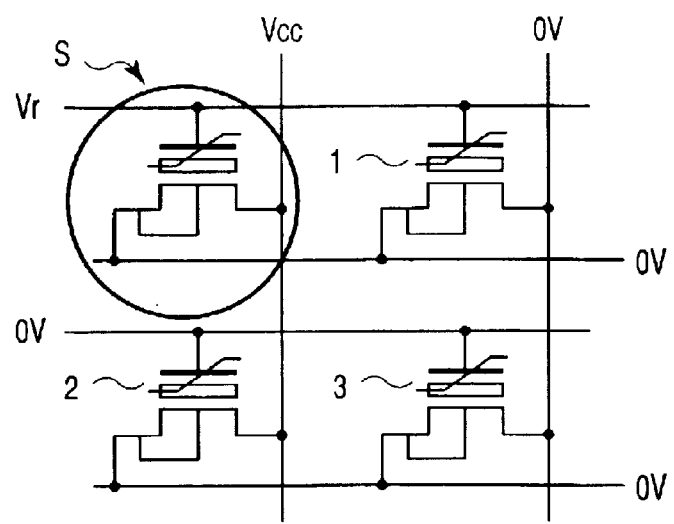

FIGS. 2A to 2C are circuit diagrams showing different operation modes of the array shown in FIG. 1. That is, FIGS. 2A, 2B, and 2C correspond to the data program mode, data erase mode, and data read mode, respectively.

Table 1 shows the bias conditions of the selected cell S and non-selected cells 1, 2, and 3 in these data program mode, erase mode, and read mode.

TABLE 1

|  | WLn (SWL) | WLn + 1 (NSWL) | BLm (SBL) | BLm + 1 (NSBL) | SLn (SSL) | SLn + 1 (NSSL) |
|---|---|---|---|---|---|---|
| Program | Vpp | Vm | 0 V | Vpp | F | 0 V |
| Erase | 0 V | Vm | Vpp | 0 V | F | 0 V |
| Read | Vr | 0 V | Vcc | 0 V | 0 V | 0 V |

In Table 1, reference symbol WLn denotes a word line SWL (Selected Word Line) of a selected cell (selected row); WLn+1, a word line NSWL (Non Selected Word Line) of a non-selected cell (non-selected row); BLm, a bit line SBL (Selected Bit Line) of a selected cell (selected column); BLm+1, a bit line NSBL (Non Selected Bit Line) of a non-selected cell (non-selected column); SLn, a source line SSL (Selected Source Line) of a selected cell (selected row); and SLn+1, a source line NSSL (Non Selected Source Line) of a non-selected cell (non-selected row).

Reference symbol Vcc denotes a normal power supply voltage; Vr, a read voltage; Vm, a medium voltage; Vpp, a program voltage; and F, a floating state. The set relationships are $0V < Vcc < Vr < Vm < Vpp$ and $Vm = Vpp/2$.

Figure 3:
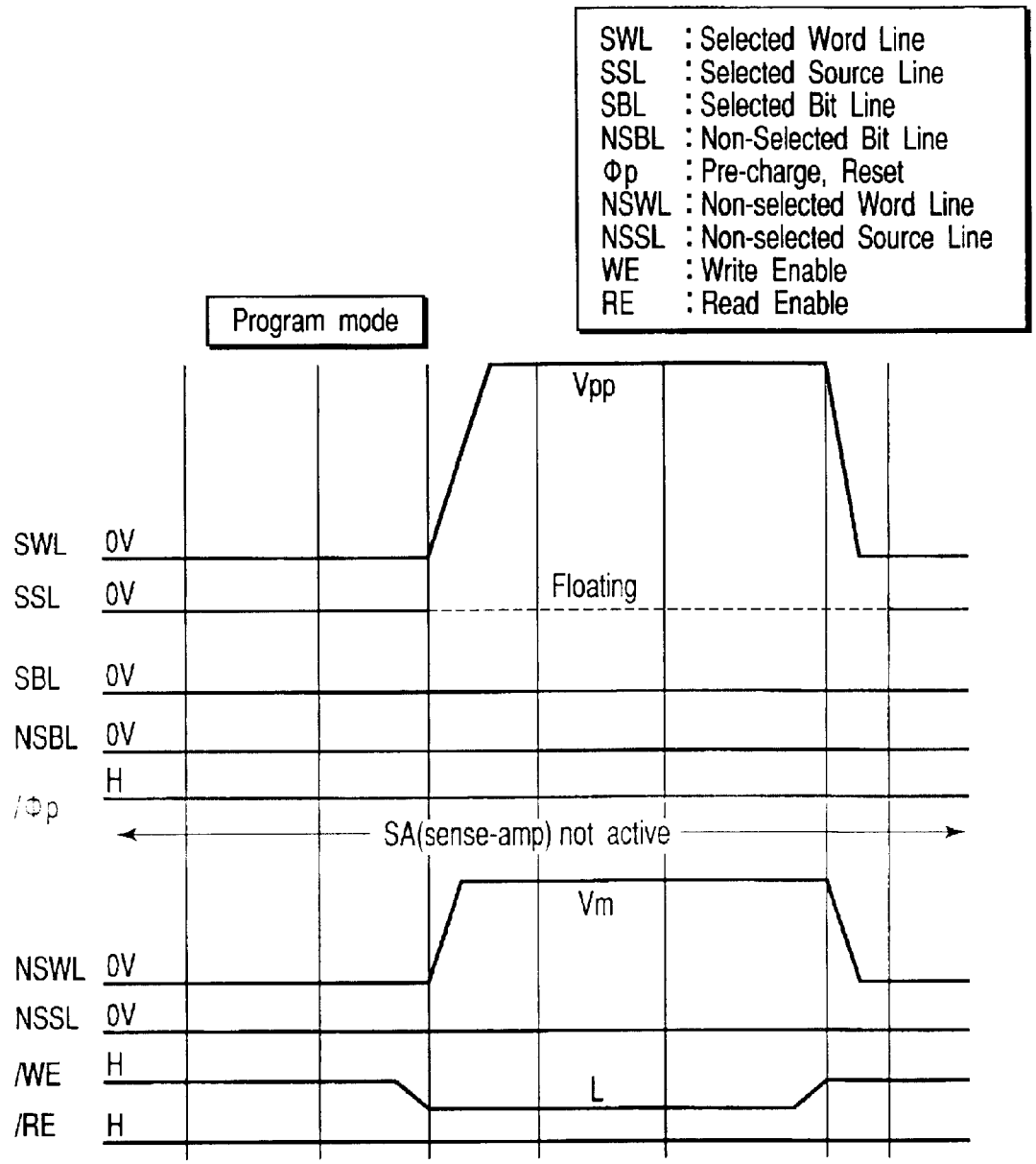
FIG. 3 is a timing chart showing an operation example in the program mode shown in FIG. 2A.
Figure 4:
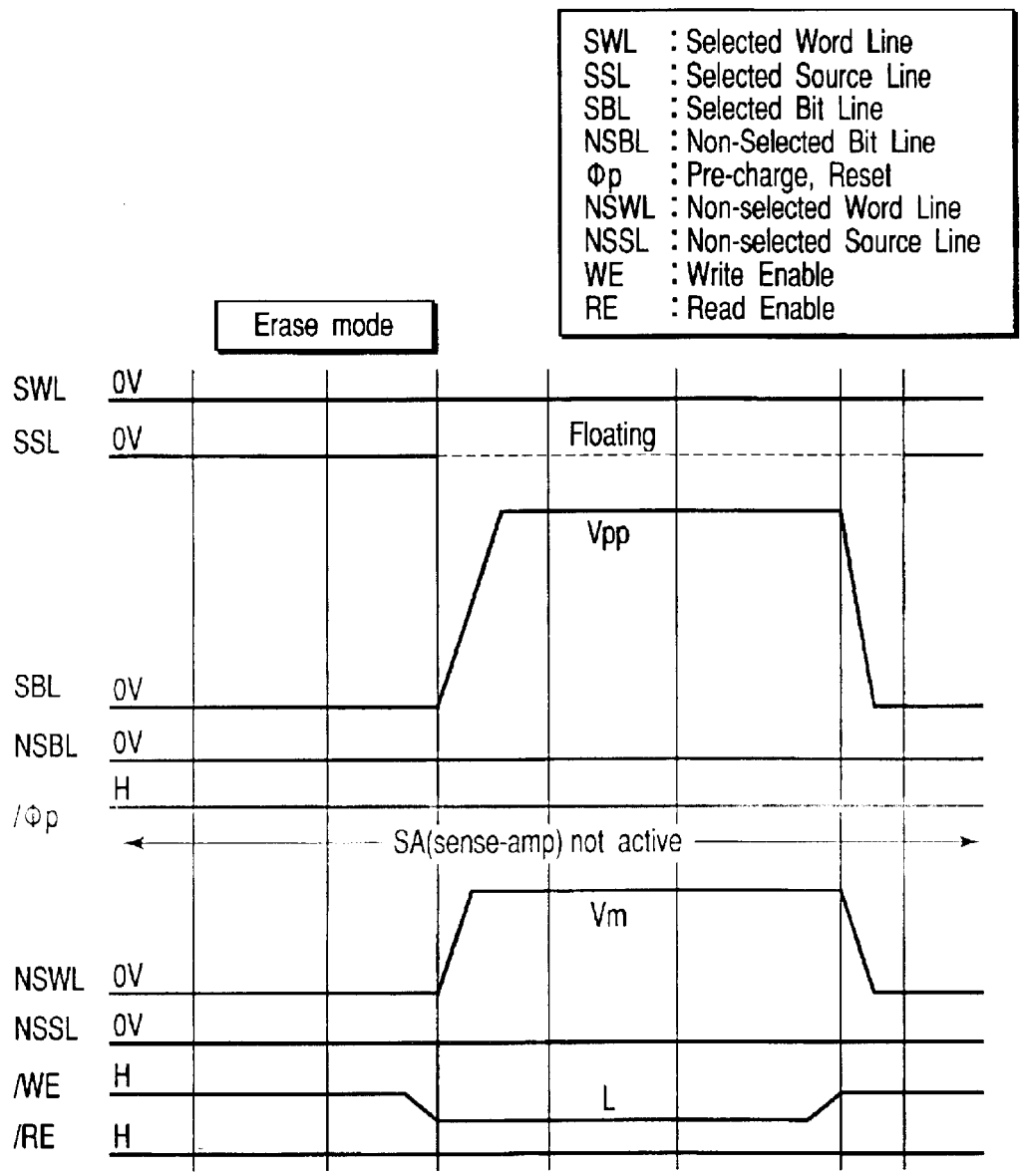
FIG. 4 is a timing chart showing an operation example in the erase mode shown in FIG. 2B.
Figure 5:
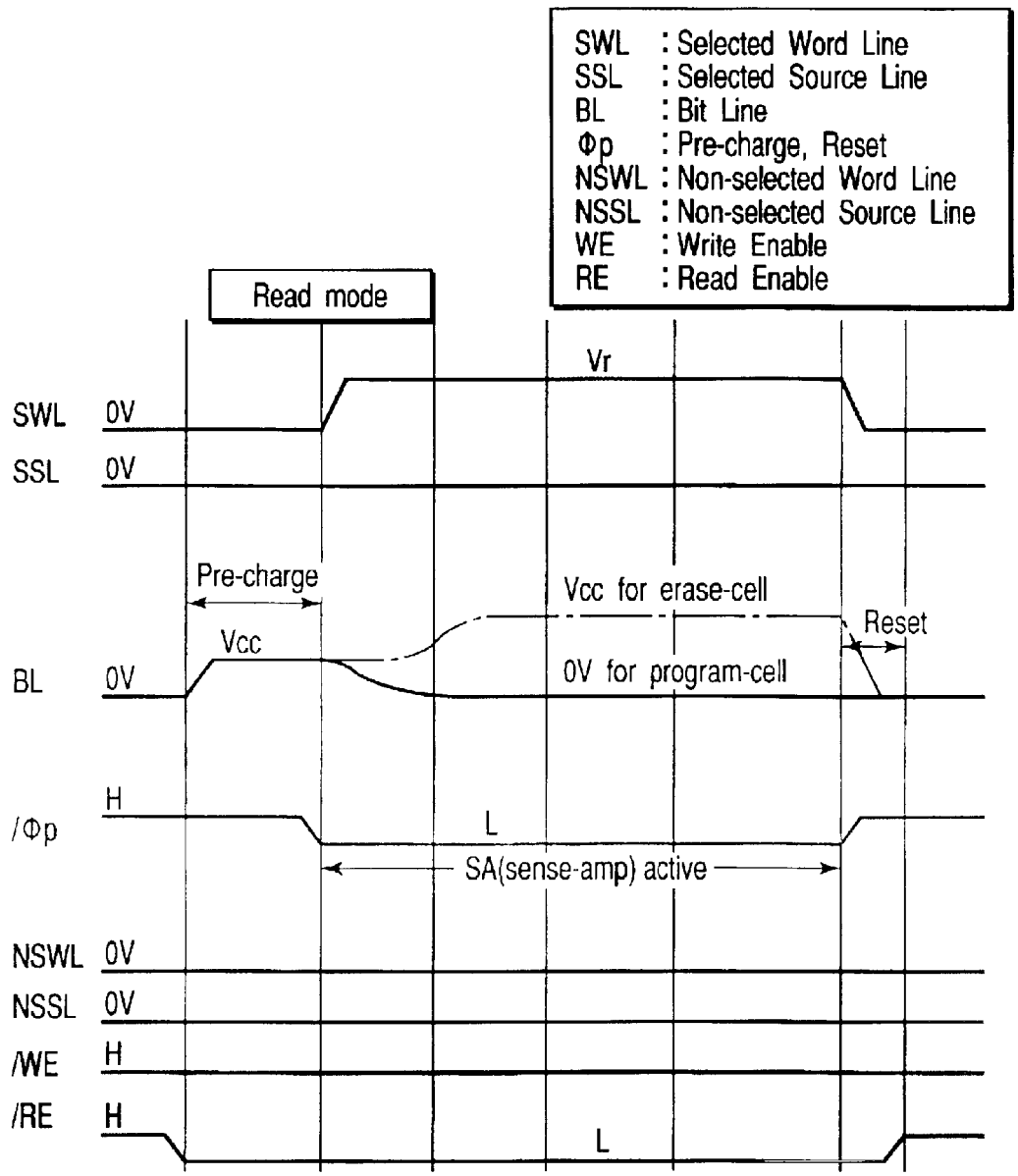
FIG. 5 is a timing chart showing an operation example in the read mode shown in FIG. 2C.

FIGS. 3, 4, and 5 are timing charts showing operation examples in the program mode, erase mode, and read mode shown in FIGS. 2A, 2B, and 2C, respectively.

In the program mode shown in FIG. 3, a signal /WE (Write Enable Bar) is activated, the voltage of the source line SSL of a selected cell is set to float, and the word line SWL of this selected cell is raised to the program voltage Vpp. If in this state the voltage of the bit line SBL of the selected cell is 0V, programming is performed. If in this state the voltage of the bit line SBL of the selected cell is Vpp, no programming is performed since both the bit line voltage and word line voltage are Vpp. During the operation, the voltage of the word line NSWL of a non-selected cell is the medium voltage Vm. Since the voltage difference between the bit line voltage and word line voltage is small, no programming is performed. After that, the signal /WE is deactivated, and the word line SWL of the selected cell is reset from the program voltage Vpp to 0V. Also, the voltage of the word line NSWL of the non-selected cell is reset from the medium voltage Vm to 0V, and the program mode is completed.

In the erase mode shown in FIG. 4, the signal /WE is activated, the voltage of the source line SSL of a selected cell is set to float, and the bit line SBL of this selected cell is raised to the program voltage Vpp. If in this state the voltage of the word line SWL of the selected cell is 0V, erase is performed. During the operation, the voltage of the word line NSWL of a non-selected cell is the medium voltage Vm. Since the voltage difference between the bit line voltage and word line voltage is small, no erase is performed. After that, the signal /WE is deactivated, and the bit line SBL of the selected cell is reset from the program voltage Vpp to 0V. Also, the voltage of the word line NSWL of the non-selected cell is reset from the medium voltage Vm to 0V, and the erase mode is completed.

In the read mode shown in FIG. 5, a signal /RE (Read Enable Bar) is activated to precharge the voltage of the bit line BL to Vcc. After that, a precharge•reset signal /$\phi$p changes to "L" level to activate a sense amplifier SA and at the same time raise the word line SWL of a selected cell to the read voltage Vr, thereby performing a normal read operation. As a consequence, cell information is read out to the bit line BL.

If the selected cell is a program-cell, the bit line voltage drops from Vcc to the source voltage, 0V, of the selected cell. If the selected cell is an erase-cell, the bit line voltage is held at Vcc.

The sense amplifier SA to which the bit line voltage is input is a latch type differential sense amplifier. Assume that the reference voltage of this sense amplifier SA is Vcc/2. If the bit line voltage is smaller than Vcc/2 (i.e., in the case of a program-cell), this bit line voltage is immediately attenuated to 0V and latched. If the bit line voltage is larger than Vcc/2 (i.e., in the case of an erase-cell), this bit line voltage is amplified to Vcc and latched by the sense amplifier SA.

Since the sense amplifier SA is electrically connected to the bit line BL at that time, the latch voltage is fed back as a bit line voltage. That is, the final bit line voltage obtained via the sense amplifier SA is changed to and held at 0V when the selected cell is a program-cell, and is changed to and held at Vcc when the selected cell is an erase-cell. The precharge•reset signal /$\phi$p changes to "H" level to reset (deactivate) the sense amplifier SA, and the word line SWL of the selected signal is reset from the read voltage Vr to 0V. After that, the signal /RE is deactivated, and the read mode is completed.

Figure 6:
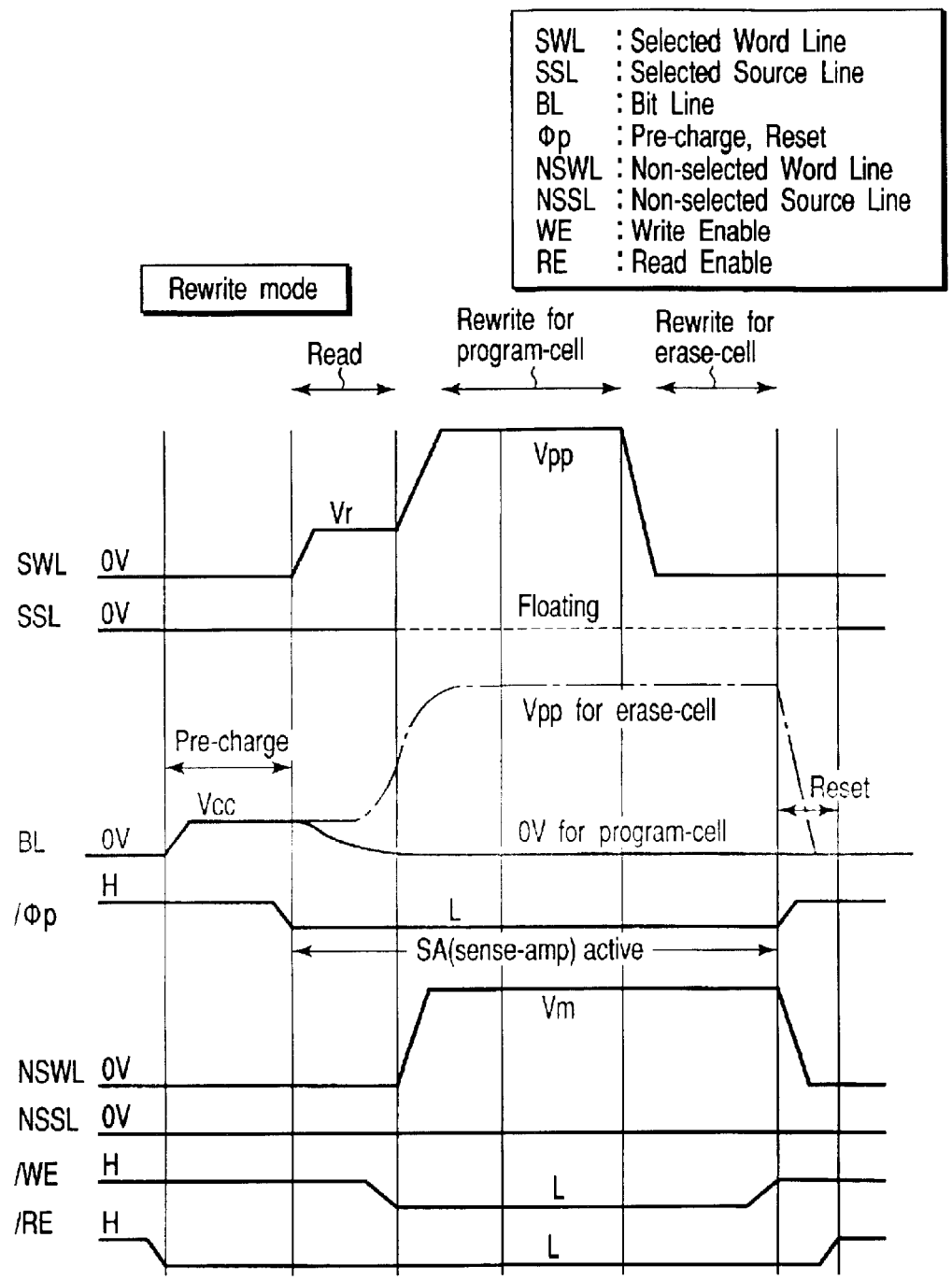
FIG. 6 is a timing chart showing an operation example of a rewrite mode of the ferroelectric memory shown in FIG. 1.
Figure 9:
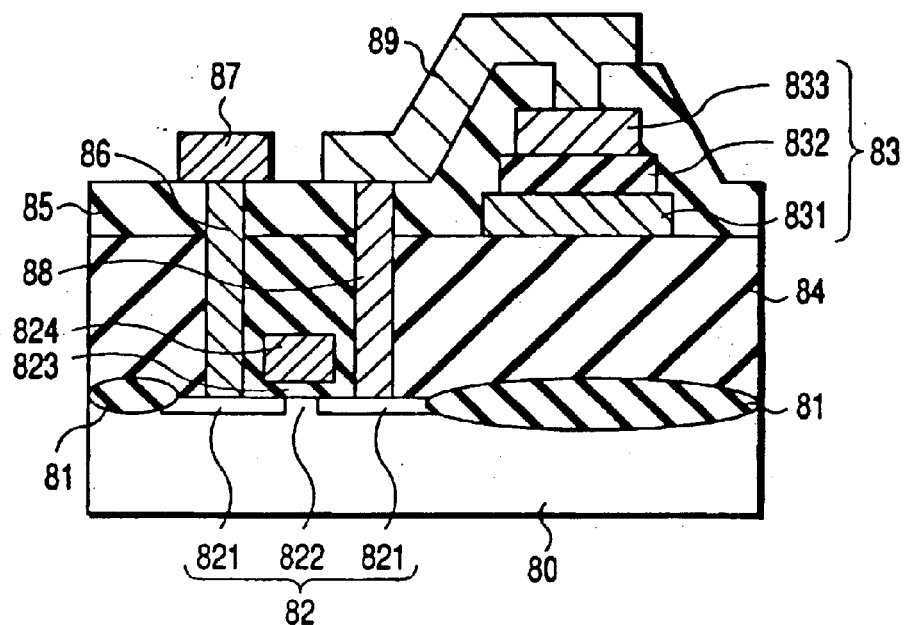
FIG. 9 is a sectional view showing the structure of a representative 1T•1C ferroelectric memory cell.

FIG. 6 is a timing chart showing an operation example in the rewrite mode of the ferroelectric memory shown in FIG. 1. FIG. 7 is a circuit diagram showing an example of a high-breakdown-voltage bit line sense amplifier used in this rewrite mode shown in FIG. 6.

This high-breakdown-voltage sense amplifier is a latch type CMOS differential sense amplifier. This differential sense amplifier is set up by a plurality of high-breakdown-voltage MIS transistors capable of withstanding the voltage Vpp used in the program mode or erase mode.

More specifically, a PMOS sense amplifier 71 is connected between a pair of input nodes and a Vpp node. When activating the PMOS sense amplifier 71, the voltage supplied to the Vpp node starts with Vcc as the initial value and then is increased to Vpp as the final value, in order to stabilize the operation of the amplifier 71. This PMOS sense amplifier 71 includes two pull-up PMOS transistors and one PMOS transistor for activation control. An activation control signal A is input to the gate of this PMOS transistor for activation control. An NMOS sense amplifier 72 is connected between the pair of input nodes described above and a 0V node. This NMOS sense amplifier 72 includes two pull-down NMOS transistors and one NMOS transistor for activation control. An activation control signal B is input to the gate of this NMOS transistor for activation control.

Of the pair of input nodes, a first input node is connected to the bit line BL via an NMOS transistor 73 as a transfer gate. A second input node is connected to a reference voltage Vcc/2 node via an NMOS transistor 74 as a transfer gate, and is also connected to the 0V node via a capacitor 75. Note that the first input node also functions as a latch output node and is connected to a read circuit section 76 via a level shifter 77 (a circuit for converting the Vpp level to the Vcc level).

As will be described below, a normal read operation is performed first in the rewrite mode shown in FIG. 6. However, a rewrite mode and a read operation may be executed separately from and independently of each other (FIG. 8).

In the rewrite mode shown in FIG. 6, the signal /RE is activated to precharge the voltage of the bit line BL to Vcc. After that, the precharge•reset signal /$\phi$p changes to "L" level to activate the sense amplifier SA and at the same time raise the word line SWL of a selected cell to the read voltage Vr, thereby performing a normal read operation. As a consequence, cell information is read out to the bit line BL.

If the selected cell is a program-cell, the voltage of the bit line BL drops from Vcc to the source voltage, 0V, of the selected cell. If the selected cell is an erase-cell, the voltage of the bit line BL is held at Vcc.

After that, the voltage of the bit line BL is input to the high-breakdown-voltage, latch type differential sense amplifier H-SA shown in FIG. 7. Assume that the reference voltage of this sense amplifier H-SA is Vcc/2. If the voltage of the bit line BL is smaller than Vcc/2 (i.e., in the case of a program-cell), this voltage of the bit line BL is immediately attenuated to 0V and latched. If the voltage of the bit line BL is larger than Vcc/2 (i.e., in the case of an erase-cell), this voltage of the bit line BL is amplified to Vpp and latched by the sense amplifier H-SA.

Since the sense amplifier H-SA is electrically connected to the bit line BL at that time, the latch voltage is fed back as a bit line voltage. That is, the final bit line voltage obtained via the sense amplifier H-SA is changed to and held at 0V when the selected cell is a program-cell, and is changed to and held at Vpp when the selected cell is an erase-cell.

In synchronism with the above-mentioned transition of the bit line voltage, the voltage of the source line SSL of the selected cell is set to float and, as a first phase, the word line SWL of the selected cell is raised to Vpp. If in this state the voltage read out from the selected cell to the bit line BL is 0V (i.e., in the case of a program-cell), rewrite is automatically performed. If the voltage read out from the selected cell to the bit line BL is Vpp (i.e., in the case of an erase-cell), neither programming nor erase is performed because both the bit line voltage and word line voltage are Vpp.

Subsequently, as a second phase, that voltage of the word line SWL of the selected cell, which is raised to Vpp as described above is lowered to 0V. If in this state the voltage read out from the selected cell to the bit line BL is 0V (i.e., in the case of a program-cell), neither programming nor erase is performed since both the bit line voltage and word line voltage are 0V. If the voltage read out from the selected cell to the bit line BL is Vpp (i.e., in the case of an erase-cell), re-erase is automatically performed.

While the rewrite and re-erase described above are performed, the voltage of the word line NSWL of a non-selected cell is the medium voltage Vm. Hence, neither rewrite nor re-erase is performed.

After that, the signal /WE is deactivated, and the precharge•reset signal /φp changes to "H" level to reset the sense amplifier SA. Also, the voltage of the word line NSWL of the non-selected cell is reset from the medium voltage Vm to 0V. In addition, the signal /RE is deactivated, and the rewrite mode is completed.

As described above, the ferroelectric memory of this embodiment has a cell array in which MFMIS ferroelectric memory cells are arranged in a matrix format. The gates of ferroelectric memory cells in the same row are connected to a common word line. The drains of ferroelectric memory cells in the same column are connected to a common bit line. The sources of ferroelectric memory cells in the same row are connected to a common source line. This ferroelectric memory can selectively execute the data read mode, program mode, erase mode, and rewrite mode.

In the operation of the rewrite mode, a read voltage (Vr in FIG. 6) is applied to a word line connected to the gate of a selected ferroelectric memory cell, thereby reading out data in this ferroelectric memory cell to a bit line. Immediately after that, a program voltage (Vpp in FIG. 6) is continuously applied to the word line, and then an erase voltage (0V in FIG. 6) is also continuously applied to the word line. In parallel with this voltage application, the voltage when the data in the cell is read out to the bit line is amplified and latched by the high-breakdown-voltage sense amplifier. This latched voltage is fed back to the bit line.

Consequently, if the data read out from the memory cell to the bit line is in a programmed state (or erased state), rewrite (or re-erase) is executed. In this manner, rewrite of the data to the ferroelectric memory cell can be automatically performed in the internal circuit. By this rewrite operation, stable memory information can always be ensured. This effect is particularly remarkable when the memory information holding time (retention) shortens owing to deterioration of the quality of the ferroelectric film of the ferroelectric memory cell or electrical disturb to a non-selected memory cell.

As is well known, in the refresh mode of a DRAM a rewrite operation is always performed after a read operation. By contrast, in the ferroelectric memory of this embodiment, the read mode and rewrite mode can be independently handled (selected). Therefore, it is possible to execute the rewrite mode in addition to the read mode in a normal operation, and execute only the rewrite mode in accordance with the retention of a memory device in a certain predetermined cycle (e.g., each day).

The following arrangement can be used to execute the rewrite mode in accordance with the retention in a certain predetermined cycle as described above. Assume, for example, that the ferroelectric memory of this embodiment is disposed in a system LSI in which the system circuit 11 (FIG. 1) is formed. In this case, the data holding time of the ferroelectric memory cell is monitored while the power supply of this system LSI is kept ON. Immediately before this data holding time exceeds a previously designated predetermined time (e.g., one day, three days, or five days), a data rewrite operation to the ferroelectric memory cell is automatically executed in the system.

Also, the following arrangement can be used to maintain data in the ferroelectric memory cell. That is, immediately before the system LSI is powered off, data held in the ferroelectric memory is stored in the storage device 12 (FIG. 1). This storage device can be an internal nonvolatile memory, e.g., an EEPROM of the system LSI or an external storage device of the system LSI. Immediately after the system LSI is powered on, the stored data is returned (loaded) from this storage device to the ferroelectric memory cell.

(Modification of First Embodiment)

In the rewrite mode of the first embodiment described above, the order of rewrite and re-erase can also be reversed. In this case, the voltage of the word line SWL of a selected cell is dropped to 0V as the first phase. Also, as the second phase, the voltage of the word line SWL of the selected cell is raised from 0V to Vpp. After that, when the signal /WE is deactivated, the voltage of the word line SWL of the selected cell is dropped to 0V.

(Second Embodiment: Switching of Sense Amplifiers SA)

In the first embodiment, the high-breakdown-voltage sense amplifier H-SA is used in a rewrite operation in which the bit line voltage is the high voltage Vpp. On the other hand, the sense amplifier SA used in the normal read mode that is not the rewrite mode has not been described in detail above.

If the high-breakdown-voltage sense amplifier H-SA is used in the normal read mode, the read time may be delayed. The second embodiment relates to switching of sense amplifiers SA based on this respect.

FIG. 8 is a circuit diagram showing examples of two types of sense amplifiers and their switching circuit used in an MFMIS ferroelectric memory according to a second embodiment.

In this sense amplifier switching circuit, a high-breakdown-voltage sense amplifier H-SA 82 is connected to a bit line BL via a first transfer gate 81 which is switched by a control clock φ1. A low-breakdown-voltage sense amplifier L-SA 84 is connected to the bit line BL via a second transfer gate 83 which is switched by an inverse control clock /φ1. The high-breakdown-voltage sense amplifier H-SA 82 and low-breakdown-voltage sense amplifier L-SA 84 are connected to a read circuit 85 for selectively sensing and amplifying the outputs from these sense amplifiers. When the high-breakdown-voltage sense amplifier H-SA 82 is used, only a rewrite operation is performed without a read operation by a control clock φ2.

With this arrangement, it is possible to use the high-breakdown-voltage sense amplifier H-SA in the rewrite mode, and to use the high-speed, low-breakdown-voltage sense amplifier L-SA in the normal read mode. The use of the high-speed, low-breakdown-voltage sense amplifier L-SA in a normal read operation achieves the effect of avoiding the read time delay produced when the high-breakdown-voltage sense amplifier H-SA is used.

In each of the above embodiments, sense amplifiers other than latch type sense amplifiers can also be used to perform sense amplification and feedback to a bit line in the normal read/rewrite mode.

In the ferroelectric semiconductor memory according to each embodiment described above, the rewrite mode can be executed by the function of performing rewrite to the MFMIS ferroelectric memory cell. Therefore, even when the memory information holding time (retention) reduces owing to deterioration of the quality of the ferroelectric film of the ferroelectric memory cell or electrical disturb to a non-selected cell, stable memory information can always be ensured by the rewrite operation.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A ferroelectric semiconductor memory comprising:
   a cell array in which a plurality of ferroelectric memory cells are arranged in a matrix format, each memory cell including a field-effect transistor and a capacitor formed as a gate electrode section of the field-effect transistor and having a stacked structure of metal film/ferroelectric film/metal film;
   a circuit section which selectively executes a read mode, program mode, and erase mode configured to perform data read, programming, and erase to the memory cells, and a rewrite mode configured to refresh data stored in each memory cell, by rewriting;
   said ferroelectric memory cells comprising a gate, a drain, and a source;
   said circuit section comprising,
   word lines disposed in one-to-one correspondence with rows of the matrix format of the memory cells, each word line being connected to gates of a plurality of memory cells in the same row,
   bit lines disposed in one-to-one correspondence with columns of the matrix format of the memory cells, each bit line being connected to drains of a plurality of memory cells in the same column, and
   source lines disposed in one-to-one correspondence with rows of the matrix format of the memory cells, each source line being connected to sources of a plurality of memory cells in the same row;
   the circuit section comprising a sense circuit connected to the bit lines;
   the sense circuit comprising a high-breakdown-voltage sense amplifier; and
   in the rewrite mode, the circuit section is configured to successively apply a program voltage and erase voltage to a word line corresponding to a selected memory cell and, in parallel with this voltage application, causes the high-breakdown-voltage sense amplifier to amplify a voltage read out to a bit line corresponding to the selected memory cell, and feeds the amplified voltage back to the corresponding bit line.

2. A memory according to claim 1, wherein the circuit section further comprises a unit which generates signals for executing the read mode, program mode, erase mode, and rewrite mode.

3. A memory according to claim 1, wherein the rewrite mode is performed in addition to the read mode and does not include any read operation.

4. A memory according to claim 1, wherein the rewrite mode is executed independently of the read mode and includes a read operation.

5. A memory according to claim 1, wherein the circuit section further comprises a word line drive circuit, bit line drive circuit, and source line drive circuit respectively connected to the word lines, bit lines, and source lines.

6. A memory according to claim 1, wherein in the rewrite mode, the circuit section applies a read voltage to the corresponding word line to read out data in the selected memory cell to the corresponding bit line and, immediately after that, applies the program voltage and erase voltage to the corresponding word line, and feeds the readout voltage back to the corresponding bit line.

7. A memory according to claim 1, wherein in the rewrite mode, the circuit section first applies the program voltage and then applies the erase voltage.

8. A memory according to claim 1, wherein in the rewrite mode, the circuit section first applies the erase voltage and then applies the program voltage.

9. A memory according to claim 1, wherein the program voltage is higher than the read voltage, and the erase voltage is 0V.

10. A memory according to claim 1, wherein
    the sense circuit comprises a low-breakdown-voltage sense amplifier in addition to the high-breakdown-voltage sense amplifier, and
    the circuit section switches the sense amplifiers to use the low-breakdown voltage sense amplifier to read out data from the memory cells, and use the high-breakdown-voltage sense amplifier to amplify the voltage to be fed back in the rewrite mode.

11. A memory according to claim 1, wherein the high-breakdown-voltage sense amplifier comprises a differential sense amplifier which latches a bit line voltage, the differential sense amplifier being set up by a plurality of high-breakdown-voltage MIS transistors which withstand the program voltage used in the program mode.

12. A memory according to claim 1, wherein the memory is disposed in a system integrated circuit in which a system circuit is formed, the data holding time of the memory cells is monitored while the power supply of the system integrated circuit is kept ON, and, immediately before this data holding time exceeds a previously designated predetermined time, the rewrite mode is automatically executed.

13. A memory according to claim 1, wherein the memory is disposed in a system integrated circuit in which a system circuit is formed, data held in the memory cells is stored in a storage device immediately before the system integrated circuit is powered off, and the data is returned from the storage device to the memory cells immediately after the system integrated circuit is powered on.

14. A method of using a memory having a cell array in which a plurality of ferroelectric memory cells are arranged in a matrix format, each memory cell including a field-effect transistor and a capacitor formed as a gate electrode section of the field-effect transistor and having a stacked structure of metal film/ferroelectric film/metal film, and a circuit section which selectively executes a read mode, program mode, and erase mode configured to perform data read, programming, and erase to the memory cells, and a rewrite mode configured to refresh data stored in each memory cell, by rewriting, wherein
    the rewrite mode is executed in addition to the read mode,
    the read mode comprises applying a read voltage to a word line corresponding to a selected memory cell, and reading out data in the selected memory cell to a corresponding bit line, and the rewrite mode comprises successively applying a program voltage and erase voltage to the corresponding word line immediately after the read mode and, in parallel with this application, causing a high-breakdown-voltage sense amplifier to amplify a voltage read out to the corresponding bit line, and feeding the amplified voltage to the corresponding bit line.

15. A method of using a memory having a cell array in which a plurality of ferroelectric memory cells are arranged in a matrix format, each memory cell including a field-effect transistor and a capacitor formed as a gate electrode section of the field-effect transistor and having a stacked structure of metal film/ferroelectric film/metal film, and a circuit section which selectively executes a read mode, program mode, and erase mode configured to perform data read, programming, and erase to the memory cells, and a rewrite mode configured to refresh data stored in each memory cell, by rewriting, wherein the rewrite mode is executed independently of the read mode, and comprises:

applying a read voltage to a word line corresponding to a selected memory cell, and reading out data in the selected memory cell to a corresponding bit line, and successively applying a program voltage and erase voltage to the corresponding word line immediately after the reading out and, in parallel with this voltage application, causing a high-breakdown-voltage sense amplifier to amplify a voltage read out to the corresponding bit line, and feeding the amplified voltage to the corresponding bit line.

16. A method according to claim 15, wherein the memory is disposed in a system integrated circuit in which a system circuit is formed, the data holding time of the memory cells is monitored while the power supply of the system integrated circuit is kept ON, and, immediately before this data holding time exceeds a previously designated predetermined time, the rewrite mode is automatically executed.

17. A method according to claim 16, wherein data held in the memory cells is stored in a storage device immediately before the system integrated circuit is powered off, and the data is returned from the storage device to the memory cells immediately after the system integrated circuit is powered on.

18. A method according to claim 14, wherein the memory is disposed in a system integrated circuit in which a system circuit is formed, data held in the memory cells is stored in a storage device immediately before the system integrated circuit is powered off, and the data is returned from the storage device to the memory cells immediately after the system integrated circuit is powered on.

19. A ferroelectric semiconductor memory comprising:

a cell array in which a plurality of ferroelectric memory cells are arranged in a matrix format, each memory cell including a field-effect transistor and a capacitor formed as a gate electrode section of the field-effect transistor and having a stacked structure of metal film/ferroelectric film/metal film; and a circuit section which selectively executes a read mode, program mode, and erase mode configured to perform data read, programming, and erase to the memory cells, and a rewrite mode configured to refresh data stored in each memory cell, by rewriting, wherein the memory is disposed in a system integrated circuit in which a system circuit is formed, data held in the memory cells is stored in a storage device immediately before the system integrated circuit is powered off, and the data is returned from the storage device to the memory cells immediately after the system integrated circuit is powered on.

* * * * *